United States Patent
Chu et al.

(10) Patent No.: US 6,591,898 B1
(45) Date of Patent: Jul. 15, 2003

(54) INTEGRATED HEAT SINK SYSTEM FOR A CLOSED ELECTRONICS CONTAINER

(75) Inventors: Richard C. Chu, Hopewell Junction, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/176,217

(22) Filed: Jun. 20, 2002

(51) Int. Cl.[7] ................................................. F28F 7/00

(52) U.S. Cl. ............................... 165/80.4; 165/104.33; 361/698; 361/711; 361/702

(58) Field of Search ............................. 165/80.4, 80.3, 165/185, 104.33; 361/711, 724, 831, 702, 698, 689, 677

(56) References Cited

U.S. PATENT DOCUMENTS

| | | | |
|---|---|---|---|
| 4,315,300 A | | 2/1982 | Parmerlee et al. .......... 361/382 |
| 4,514,746 A | | 4/1985 | Lundgvist .................... 361/385 |
| 4,724,901 A | * | 2/1988 | Munekawa ............. 165/104.21 |
| 5,162,974 A | | 11/1992 | Currie ......................... 361/385 |
| 5,285,347 A | * | 2/1994 | Fox et al. .................... 165/80.3 |
| 5,329,993 A | * | 7/1994 | Ettehadieh ................. 165/80.4 |
| 5,647,430 A | * | 7/1997 | Tajima ................... 165/104.33 |
| 5,829,516 A | * | 11/1998 | Lavochkin ................. 165/80.4 |
| 5,878,588 A | | 3/1999 | Biancardi ....................... 62/177 |
| 5,896,922 A | | 4/1999 | Chrysler et al. ............. 165/165 |
| 5,934,364 A | | 8/1999 | Chrysler et al. ............. 165/170 |
| 5,940,270 A | | 8/1999 | Puckett ........................ 361/699 |
| 5,954,127 A | | 9/1999 | Chrysler et al. ............. 165/170 |
| 5,970,731 A | | 10/1999 | Hare et al. ................... 62/196.4 |
| 6,034,872 A | | 3/2000 | Chrysler et al. ............. 361/699 |
| 6,035,655 A | | 3/2000 | Hare et al. .................. 62/259.2 |
| 6,166,907 A | | 12/2000 | Chien ......................... 361/699 |
| 6,213,194 B1 | | 4/2001 | Chrysler et al. ............ 165/80.3 |
| 6,305,180 B1 | | 10/2001 | Miller et al. ................ 62/259.2 |
| 6,330,152 B1 | * | 12/2001 | Vos et al. .................... 361/688 |
| 6,360,814 B1 | * | 3/2002 | Tanaka et al. ......... 165/104.33 |

FOREIGN PATENT DOCUMENTS

| | | | |
|---|---|---|---|
| EP | WO 97/16949 | 10/1996 | ............ H05K/7/20 |
| JP | 8186388 | 7/1996 | ............ H05K/7/20 |

OTHER PUBLICATIONS

Chu et al., "Electronic Module With Integrated Programmable Thermoelectric Cooling Assembly and Method of Fabrication", Ser. No. 09/726,909, filed Nov. 30, 2000.

Chu et al., "Electronic Module With Integrated Thermoelectric Cooling Assembly", Ser. No. 09/726,900, filed Nov. 30, 2000.

(List continued on next page.)

*Primary Examiner*—Henry Bennett
*Assistant Examiner*—Terrell McKinnon
(74) *Attorney, Agent, or Firm*—Andrew J. Wojnicki, Esq.; Kevin P. Radigan, Esq.; Heslin Rothenberg Farley & Mesiti P.C.

(57) ABSTRACT

An integrated heat sink system is provided for internal cooling of a closed electronics container. The heat sink system includes a cold plate and a fin assembly thermally coupled to and extending from the cold plate. The cold plate has a surface for thermally coupling to one or more components within the container, such as a processor module. The heat sink system further includes at least one coolant carrier channel thermally coupled to and passing through the fins of the fin assembly. When the heat sink system is operational within the closed container, the cold plate thermally couples to and removes heat from the one or more components, the plurality of fins remove heat from air circulating within the closed container, and coolant within the coolant carrying channel(s) removes heat from the plurality of fins and from the cold plate thermally coupled thereto.

25 Claims, 3 Drawing Sheets

OTHER PUBLICATIONS

Chu et al., "Cooling System With Auxiliary Thermal Buffer Unit For Cooling An Electronics Module", Ser. No. 09/867,855, filed May 30, 2001.

Daniel B. Baer, "Method And Apparatus For Cooling Electronic Enclosures", Publications No. US 2001/0042616 A1, published Nov. 22, 2001.

V. Krinitsin, "Infinito AquaCool Water Cooling System", http://www.digit-life.com/articles/infiniproaquacool/, pp. 1–9.

J. "Agg" Rolfe, "Senfu Water–Cooling Kit", http://www.overclocker.com.au/techstuff/r_senfu_wc/, pp. 1–3.

"Leufken Technologies Universal Socket Water Cooling Kit", http://www.neoseeker.com/Hardware/Products/Leufken_sktfullg/index.html, Jan. 5, 2002, 2 pgs.

PCLincs Online Store: Cooling Products: Water Cooling: Cold Plates, Water Blocks & Hold Down Devices, http://www..pclincs.co.uk/acatalog/PCLines_Online_Store_Cold_Plates_Water_Blocks_Hold_Down_D..., Jan. 4, 2002, 3 pgs.

* cited by examiner

INTEGRATED HEAT SINK SYSTEM FOR A CLOSED ELECTRONICS CONTAINER

CROSS-REFERENCE TO RELATED PATENTS/APPLICATION

This application contains subject matter which relates to the subject matter of the following commonly-owned patents and applications, each of which is hereby incorporated herein by reference in its entirety:

"Hybrid Cooling System For Electronics Module", by Chrysler et al., U.S. Pat. No. 6,213,194, issued Apr. 10, 2001;

"Modular Refrigeration System", by Hare et al., U.S. Pat. No. 6,035,655, issued Mar. 14, 2000;

"Cooling Computer Systems", by Chrysler et al., U.S. Pat. No. 6,034,872, issued Mar. 7, 2000;

"Modular Refrigeration System", by Hare et al., U.S. Pat. No. 5,970,731, issued Oct. 26, 1999;

"Cold Plate For Dual Refrigeration System", by Chrysler et al., U.S. Pat. No. 5,954,127, issued Sep. 21, 1999;

"Cold Plate For Dual Refrigeration Systems", by Chrysler et al., U.S. Pat. No. 5,934,364, issued Aug. 10, 1999;

"Cold Plate For Dual Refrigeration Systems", by Chrysler et al., U.S. Pat. No. 5,896,922, issued Apr. 27, 1999;

"Electronic Module With Integrated Programmable Thermoelectric Cooling Assembly and Method of Fabrication", by Chu et al., U.S. application Ser. No. 09/726,909, filed Nov. 30, 2000;

"Electronic Module With Integrated Thermoelectric Cooling Assembly", by Chu et al., U.S. application Ser. No. 09/726,900, filed Nov. 30, 2000; and "Cooling System With Auxiliary Thermal Buffer Unit For Cooling An Electronics Module", by Chu et al., U.S. application Ser. No. 09/867,855, filed May 30, 2001.

TECHNICAL FIELD

The present invention relates to an integrated heat sink system for cooling multiple heat dissipating components within an enclosed container. More particularly, this invention relates to an integrated air/liquid heat sink system for removing heat from multiple heat generating components, such as electronic and computer components, located within a closed housing.

BACKGROUND OF THE INVENTION

As circuit density of electronic devices increases, there is a correspondingly increasing demand for the removal of heat generated by these devices. This increased demand arises both because the circuit devices are packed more closely together and because the circuits themselves are operated at increasingly higher clock frequencies. Runaway thermal conditions and excessive heat generated by electronic devices is a leading cause for chip failure.

Additionally, as the frequency at which computer processors operate continues to increase, and the number of independently operated processors in a given volume continues to increase (e.g., dense server applications), electromagnetic compatibility (EMC) considerations dictate that the electronics package at the rack drawer (node) level be completely enclosed for shielding purposes. Once the drawer is completely enclosed, traditional air cooling where air is forced through vents in the drawer can no longer be accomplished. One way to overcome this constraint is to water cool certain electronics within the drawer. However, components such as memory, DASD, and power supplies do not readily lend themselves to water cooling.

Therefore, there exists a need in the art for an enhanced cooling approach for removing heat from a closed electronics drawer containing multiple heat generating components.

SUMMARY OF THE INVENTION

The shortcomings of the prior approaches are overcome, and additional advantages are provided, by the present invention which in one aspect comprises an integrated heat sink system for a closed container having multiple heat generating components therein. The system includes a cold plate having a first surface for thermally coupling to at least one heat generating component of the multiple heat generating components. A fin assembly is thermally coupled to and extends from a second surface of the cold plate. The fin assembly includes a plurality of fins which remove heat from air passing therethrough when the integrated heat sink system is disposed within the closed container. Additionally, at least one coolant carrying channel is thermally coupled to and passes through at least some fins of the plurality of fins of the fin assembly. When the integrated heat sink system is employed within the closed container, the cold plate thermally couples to and removes heat from the at least one heat generating component, while the plurality of fins remove heat from air within the closed container, and coolant within the at least one coolant carrying channel removes heat from the plurality of fins and from the cold plate.

In another aspect, an electronic apparatus is provided which includes a closed container and multiple heat generating and electronic components disposed within the container. The apparatus also comprises an integrated heat sink system disposed within the container for dissipating heat generated by the electronic components. The heat sink system includes a cold plate and a fin assembly thermally coupled to and extending from the cold plate. The cold plate has a first surface thermally coupled to at least one heat generating component within the container. The heat sink system further includes at least one coolant carrying channel thermally coupled to and passing through at least some fins of the plurality of fins of the fin assembly. Operationally, the cold plate removes heat from the at least one heat generating electronic component thermally coupled thereto, the plurality of fins remove heat from air circulating within the closed container, and coolant within the coolant carrying channel removes heat from both the plurality of fins and from the cold plate.

In a further aspect, a method of fabricating an integrated heat sink system is provided. This method includes: providing a thermally coupled cold plate and fin subassembly, the subassembly including a plurality of fins extending from a surface of the cold plate, and a plurality of holes within at least some fins of the subassembly; and disposing at least one coolant carrying channel within the cold plate and fin subassembly to pass through the plurality of holes provided in the at least some fins. The disposing includes thermally coupling the at least one coolant carrying channel and the fins so that when coolant passes through the coolant carrying channel, the coolant removes heat from the fins, as well as from the cold plate thermally coupled to the fins.

Various additional enhanced structures and methods are also described and claimed herein.

Advantageously, presented herein is an integrated air/liquid heat sink system which can be utilized to effectively cool multiple components inside a completely enclosed electronics package. The integrated system accomplishes this task by doubling as a cold plate and as an air/liquid heat exchanger. The system is a cold plate in the sense that it is a water cooled device that makes direct physical contact with an electronics module and absorbs heat generated by the module. The system is also an air/liquid heat exchanger in that it absorbs heat from air that is circulated through or over other electronic devices within the closed package or housing. By integrating these two functions together in a single system, the space that a separate air/liquid heat exchanger would occupy is advantageously saved within the container, while still accomplishing the desired function of cooling the multiple electronic devices within the container.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Generally stated, provided herein is an integrated heat sink system for an enclosure containing multiple heat generating components, such as multiple electronic components. In one embodiment, the heat sink is an integral air/liquid heat sink which can be utilized to cool multiple electronic components within the enclosed container, which may be an electronics drawer of a dense server application. The heat sink accomplishes this by doubling both as a cold plate and as an air/liquid heat exchanger. By accomplishing both functions with a single structure, space is conserved within the container while still allowing for the requisite heat removal from the components.

Figure 1:
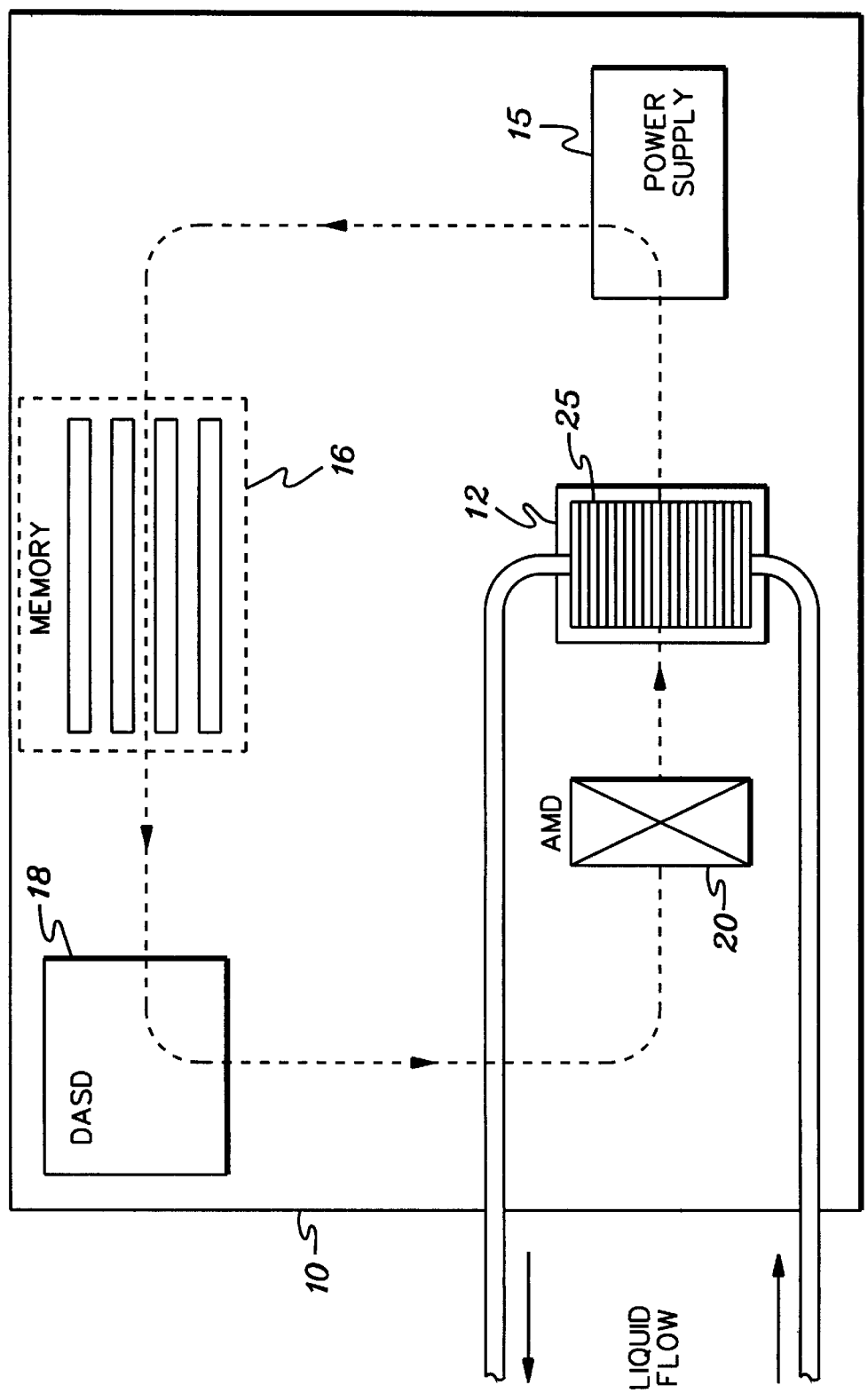
FIG. 1 is a diagram of one embodiment of a closed electronics container having multiple heat generating components therein, and employing an integrated air/liquid heat sink system, in accordance with an aspect of the present invention.

FIG. 1 depicts one embodiment of a closed container, generally denoted 10. In this example, container 10 is an electronics drawer or node of a dense server system, and is assumed to be a substantially enclosed structure. As used herein, the phrase "closed container" refers to a container which is substantially closed to mitigate electromagnetic noise that may be generated from electronic components operating within the container. In one embodiment, container 10 is assumed to lack air vents for exchange of air within the container with the ambient. By closing the container, electromagnetic radiation emanating from the container is reduced, if not eliminated. The phrase closed container does not, however, require a hermetic seal.

As shown in FIG. 1, electronics container 10 includes, in one embodiment, a processor module 12, a power supply 15, memory 16 and DASD 18. Air is circulated within container 10 by an air moving device (AMD) 20. The air is directed over/through most of the components to be cooled within the container, such as memory 16, DASD 18, PCI cards (not shown), etc.

One approach to removing heat from container 10 would be to provide a conventional air/liquid heat exchanger within the container. As air passes over the heat exchanger, heat is extracted from the air and removed via coolant running through the heat exchanger. However, processor module 12 within the container may dissipate more heat than can be accommodated simply using air flowing through a heat sink attached to the module and then through an air/liquid heat exchanger. This component typically requires direct cooling by way of a cold plate. The difficulty with a solution which uses both a conventional air/liquid heat exchanger and a cold plate is the amount of space required within the container in order to effect the desired cooling.

Presented herein is a unique approach which integrates a cold plate and an air/liquid heat exchanger into a single integral air/liquid heat sink, referred to herein as an integrated heat sink system. This system, denoted 25 in FIG. 1, would be physically coupled to (in one embodiment) processor module 12 within container 10 to allow for direct thermal extraction of heat from module 12; i.e., the base of the integrated heat sink system is adapted to mount to the processor module so that good thermal contact is made with the module.

Figure 2:
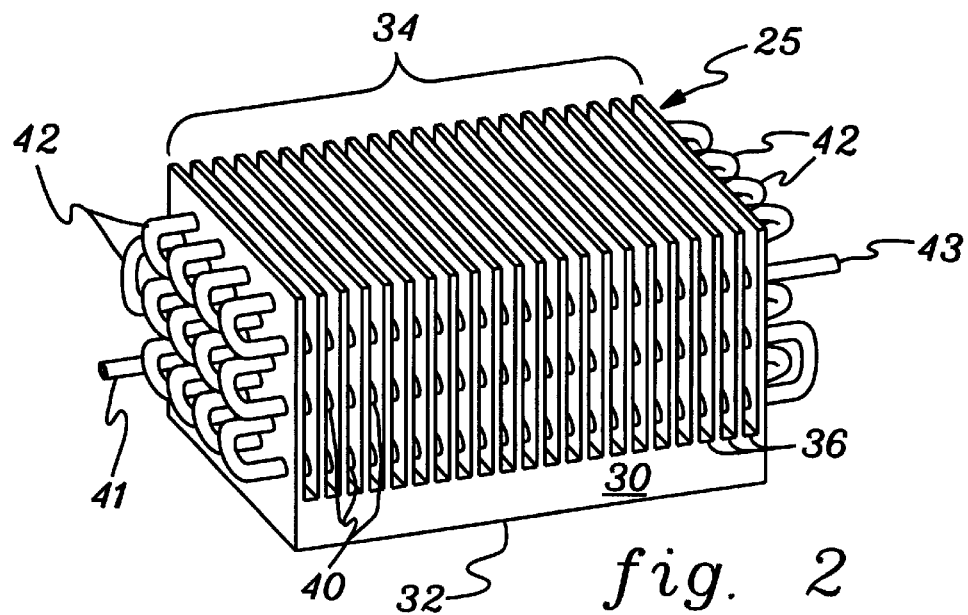
FIG. 2 is a perspective view of one embodiment of an integrated heat sink system, in accordance with an aspect of the present invention.

FIG. 2 depicts one embodiment of an integrated heat sink system 25 in accordance with the present invention. Heat sink system 25 includes a cold plate 30 having a first surface 32 sized and configured to thermally couple to a surface of one or more heat generating components, such as processor module 12 (FIG. 1), within the container. A fin assembly 34 extends from and is thermally coupled to a second surface 36 of cold plate 30. The fin assembly includes a plurality of plate fins for removing heat from air passing therethrough when the heat sink system is disposed within the closed container 10 (FIG. 1). In one embodiment, the cold plate and fin assembly could be a monolithic structure.

Figure 3A:
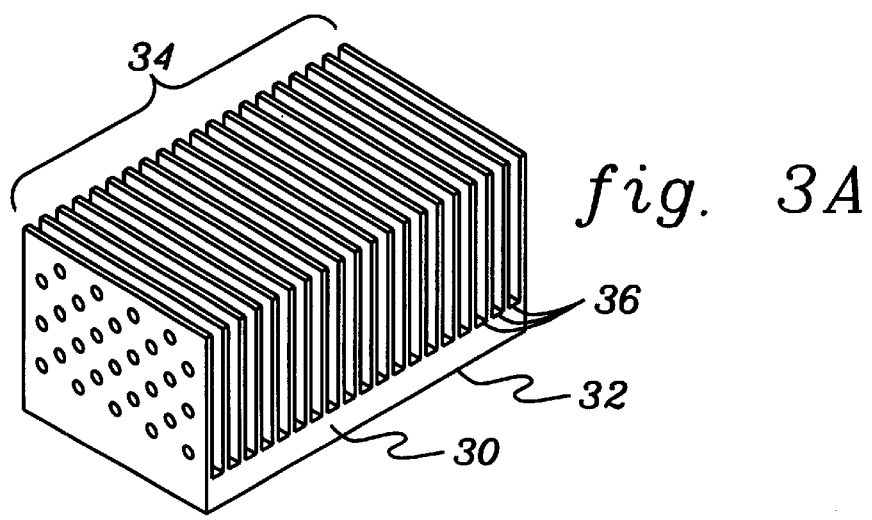
FIG. 3A is a perspective view of the cold plate and fin assembly of the integrated heat sink system of FIG. 2, in accordance with an aspect of the present invention.
Figure 3B:
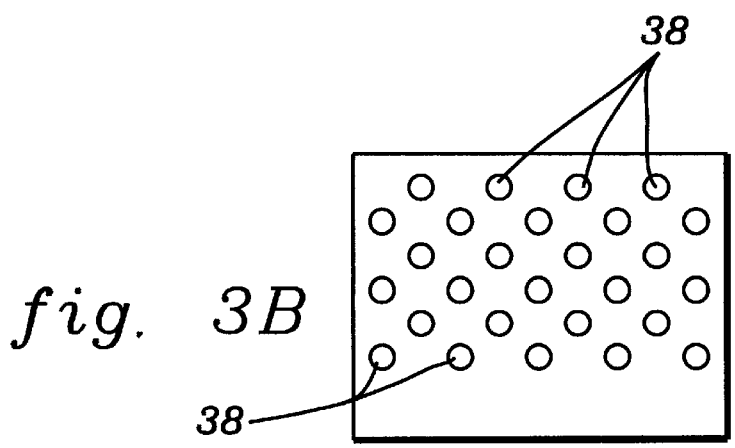
FIG. 3B is an end elevational view of the cold plate and fin assembly of FIG. 3A, in accordance with an aspect of the present invention.

The cold plate and fin assembly portion of heat sink system 25 is made of a high thermal conductivity material, such as copper or aluminum, and can be built using known heat sink manufacturing techniques with one notable addition. An array of holes (staggered or in line) are produced within the plate fins as shown in FIGS. 3A & 3B. With the heat sink in its assembled state, the clearance holes line up so that metal tubes 40 can be inserted as shown in FIG. 2. The holes 32 and tubes 40 can be of any desired cross-section and orientation. For example, any combination of circular (as shown in FIGS. 2–3A), square/diamond and elliptical cross-sections could be employed. The tube sections 40 are in good thermal contact with the plurality of heat sink fins 34. This can be accomplished in a variety of ways, including by expansion of the tubes as is done in conventional tube/fin heat exchangers, press/shrink fitting or metallurgical bonding.

The ends of the tubes can be fitted with U-bend tubes 42 as shown in FIG. 2, or can be hydraulically connected with end cap manifolds (not shown), so that coolant (such as water) can be brought into 41 and out of 43 the device and liquid can flow through the entire array of tubes 40 in some predetermined series or parallel arrangement as desired. Although not shown, the top portion of the heat sink system could be covered so that, with proper ducting, air flow can be restricted to flowing solely through the heat sink. As shown in FIG. 1, coolant flow for the coolant carrying tubes 40 & 42 can pass into and out of container 10, in one embodiment, through duct work passing through a sidewall of the container.

Operation of integrated heat sink system 25 (FIG. 2) can be described in the context of cooling electronics within a closed container 10 (FIG. 1) as follows. The base 32 of heat sink system 25 is mounted to processor module 12 so that the system is in good thermal contact with the module. Heat generated by the processor module is conducted through the base, up into the fins, and into the liquid coolant flowing through the tubes. The liquid enters and leaves the enclosure through bulk head fittings (not shown). Additionally, air is circulated within the enclosure via air moving device 20. The air is circulated over/through the heat generating components within the container to be cooled. As the air flows through the integrated heat sink system, heat picked up from the electronic components is transferred to the fins by convection, and then transferred to the coolant flowing through the coolant carrying tubes by a combination of conduction through the metal fins and tubes and by convection into the liquid.

Advantageously, by providing holes directly in at least some of the plurality of fins of the fin assembly, and passing coolant carrying channels through those holes, enhanced removal of heat is obtained from the air circulating within the container.

As one detailed example, typical fin thickness might be 0.01–0.08 inches, with fin spacing 0.05–0.10 inches. In addition, the tube diameter might be 1/8–1/2 inches, with tube spacing 3/8–3/4 inches in the fin plates. The tube pattern could be, for example, in-line or staggered.

Figure 4B:
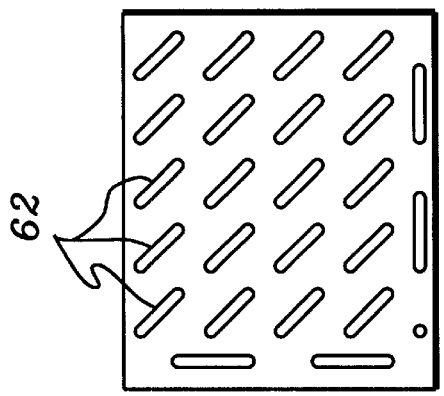
FIG. 4B is an end elevational view of the alternate heat sink system of FIG. 4A, in accordance with an aspect of the present invention.
Figure 4C:
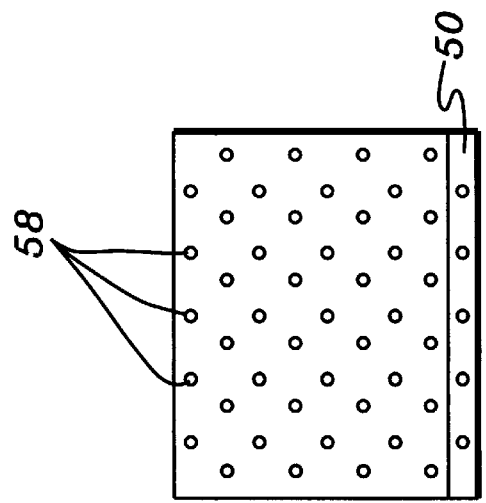
FIG. 4C is a cross-sectional view of the cold plate and fin assembly of the alternate integrated heat sink system of FIG. 4A taken along line C—C, in accordance with an aspect of the present invention.
Figure 4A:
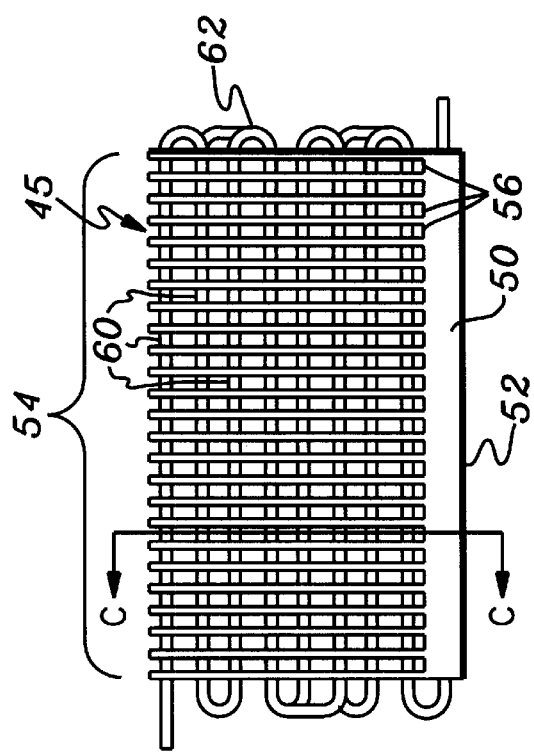
FIG. 4A is a side elevational view of an alternate embodiment of an integrated heat sink system, in accordance with an aspect of the present invention.

FIGS. 4A–4C depict an alternate embodiment of an integrated heat sink system, generally denoted 45, in accordance with the present invention. As shown in the side elevational view of FIG. 4A and end elevational view of FIG. 4B, heat sink system 45 includes a cold plate 50 having a first surface 52 designed to thermally couple to one or more heat generating components disposed within an enclosure. A fin assembly 54 extends from and thermally couples to a second surface 56 of cold plate 50. The fin assembly includes a plurality of fins for removing heat from air passing therethrough.

As shown in FIG. 4C, a plurality of holes 58 are provided within the fins of assembly 54, and within cold plate 50. These holes are sized, and aligned, to accommodate multiple coolant carrying tubes 60, as shown in FIG. 4A. Tubes 60 are, in one embodiment, interconnected using U-bend tubes 62 as shown. Inlet port 61 and outlet port 63 respectively provide coolant to and remove coolant from the integrated heat sink system. When assembled, the coolant carrying tubes 60, U-bend tubes 62 and inlet and outlet ports 61 & 63 form, in one example, one continuous coolant carrying channel.

Integrated heat sink system 45 of FIGS. 4A–4C provides additional thermal performance to cold plate 50 by passing coolant directly through the cold plate, in addition to passing coolant through the fins. The coolant can flow through the cold plate either in series or in parallel with the coolant flowing through the tubes embedded within the fins.

Those skilled in the art will note from the above description that provided herein is an integrated air/liquid heat sink system which can be utilized to effectively cool multiple components inside a completely enclosed electronics package. The integrated system efficiently accomplishes this task by doubling as a cold plate and as an air/liquid heat exchanger. Again, the system is a cold plate in the sense that it is a water cooled device that makes direct physical contact with an electronics module and absorbs heat generated by the module. The system is also an air/liquid heat exchanger in that it absorbs heat from air that is circulated through or over other electronic devices within the closed package or housing.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An integrated heat sink system for a closed container having multiple heat generating components therein, the integrated heat sink system comprising:

a cold plate having a first surface configured for thermally coupling to at least one heat generating component of the multiple heat generating components;

a fin assembly thermally coupled to and extending from a second surface of the cold plate, the fin assembly having a plurality of fins for removing heat from air passing therethrough when the integrated heat sink system is disposed within the closed container; and at least one coolant carrying channel thermally coupled to and passing through at least some fins of the plurality of fins of the fin assembly, wherein when the integrated heat sink system is employed within the closed container, the cold plate thermally couples to and removes heat from the at least one heat generating component, the plurality of fins remove heat from air within the closed container, and coolant within the at least one coolant carrying channel removes heat from the plurality of fins and from the cold plate thermally coupled thereto.

2. The integrated heat sink system of claim 1, wherein the at least one coolant carrying channel passing through the at least some fins of the plurality of fins is defined by at least one tube section, the at least one tube section comprising a thermally conductive material.

3. The integrated heat sink system of claim 1, wherein the at least one coolant carrying channel comprises a plurality of thermally conductive tube sections passing through the at least some fins, the plurality of thermally conductive tube sections being in fluid communication.

4. The integrated heat sink system of claim 3, wherein the plurality of thermally conductive tube sections are coupled in series or parallel fluid communication.

5. The integrated heat sink system of claim 3, wherein the plurality of thermally conductive tube sections pass through each fin of the plurality of fins.

6. The integrated heat sink system of claim 5, wherein at least some fins of the plurality of fins extend a height from the second surface of the cold plate sufficient to accommodate multiple rows of thermally conductive tube sections passing through the plurality of fins.

7. The integrated heat sink system of claim 1, wherein the at least one coolant carrying channel comprises a single continuous coolant carrying channel passing through the at least some fins of the plurality of fins.

8. The integrated heat sink system of claim 7, wherein coolant passes into and out of the closed container via the single continuous coolant carrying channel.

9. The integrated heat sink system of claim 1, wherein the cold plate comprises a solid plate fabricated from a thermally conductive material.

10. The integrated heat sink system of claim 1, wherein the at least one coolant carrying channel also passes through at least a portion of the cold plate, thereby directly cooling both the fin assembly and the cold plate.

11. The integrated heat sink system of claim 1, wherein the cold plate and the fin assembly comprise a monolithic structure.

12. An electronic apparatus comprising:
a closed container;
multiple heat generating electronic components disposed within the closed container; and
an integrated heat sink system also disposed within the closed container for dissipating heat generated by the multiple heat generating electronic components, the integrated heat sink system comprising:
a cold plate having a first surface thermally coupled to at least one heat generating electronic component of the multiple heat generating electronic components;
a fin assembly thermally coupled to and extending from a second surface of the cold plate, the fin assembly having a plurality of fins for removing heat from air passing therethrough; and
at least one coolant carrying channel thermally coupled to and passing through at least some fins of the plurality of fins of the fin assembly, wherein the cold plate removes heat from the at least one heat generating electronic component, the plurality of fins remove heat from air within the closed container, and coolant within the at least one coolant carrying channel removes heat from the plurality of fins and from the cold plate thermally coupled thereto.

13. The electronic apparatus of claim 12, wherein the at least one coolant carrying channel of the integrated heat sink system comprises a plurality of thermally conductive tube sections passing through the at least some fins, the plurality of thermally conductive tube sections being in series or parallel fluid communication.

14. The electronic apparatus of claim 13, wherein the plurality of thermally conductive tube sections pass through each fin of the plurality of fins.

15. The electronic apparatus of claim 14, wherein at least some fins of the plurality of fins extend a height from the second surface of the cold plate sufficient to accommodate multiple rows of thermally conductive tube sections passing through the plurality of fins.

16. The electronic apparatus of claim 12, wherein the cold plate and the fin assembly comprise a monolithic structure.

17. The electronic apparatus of claim 12, wherein the at least one coolant carrying channel also passes through a portion of the cold plate, thereby directly cooling both the fin assembly and the cold plate.

18. The electronic apparatus of claim 12, wherein the at least one heat generated electronic component to which the cold plate is thermally coupled comprises at least one processor module.

19. The electronic apparatus of claim 12, further comprising an air moving device disposed within the closed container, and positioned to circulate air through the fin assembly of the integrated heat sink system.

20. A method of fabricating an integrated heat sink system for use within a closed container having multiple heat generating components therein, the method comprising:
providing a thermally coupled cold plate and fin subassembly, the subassembly including a plurality of fins extending from a surface of the cold plate, and a plurality of holes within at least some fins of the subassembly; and
disposing at least one coolant carrying channel within the cold plate and fin subassembly to pass through the plurality of holes provided in the at least some fins, the disposing including thermally coupling the at least one coolant carrying channel and the at least some fins of the plurality of fins, wherein when coolant passes through the at least one coolant carrying channel, the coolant removes heat from the plurality of fins, as well as from the cold plate thermally coupled to the plurality of fins.

21. A method of claim 20, wherein the providing further comprises providing the subassembly with a plurality of holes within each fin of the subassembly, and wherein the disposing comprises disposing the at least one coolant carrying channel to pass through the plurality of holes provided in each fin of the plurality of fins.

22. The method of claim 20, wherein the providing includes providing the subassembly wherein at least some fins extending a height from the cold plate sufficient to accommodate multiple rows of holes.

23. The method of claim 22, wherein the disposing comprises disposing a plurality of thermally conductive tube sections in the holes of the fin subassembly, wherein the plurality of thermally conductive tube sections are in parallel or series fluid communication.

24. The method of claim 23, wherein the disposing further comprises providing at least one hole in the cold plate for provision of at least one thermally conductive tube section therein, thereby allowing direct cooling of both the plurality of fins and the cold plate.

25. The method of claim 20, wherein the providing comprises providing the cold plate and fin subassembly as a thermally conductive monolithic structure.

* * * * *